United States Patent [19]

Van Damme et al.

[11] Patent Number: 5,994,023
[45] Date of Patent: Nov. 30, 1999

[54] ACID-SENSITIVE SUBSTANCE AND PHOTOSENSITIVE COMPOSITIONS THEREWITH

[75] Inventors: Marc Van Damme, Heverlee; Joan Vermeersch, Deinze; Stefan Van Steenkiste, De Pinte; Etienne Schacht, Staden, all of Belgium

[73] Assignee: Agfa-Gevaert, N.V., Mortsel, Belgium

[21] Appl. No.: 08/897,672

[22] Filed: Jul. 21, 1997

Related U.S. Application Data

[60] Provisional application No. 60/026,550, Sep. 23, 1996.

[30] Foreign Application Priority Data

Jul. 19, 1996 [EP] European Pat. Off. .............. 96202048

[51] Int. Cl.[6] ............................ G03F 7/021; G03F 7/039; G03F 7/09
[52] U.S. Cl. ...................... 430/176; 430/271.1; 430/944; 430/270.1; 101/457; 101/463; 101/453; 525/328.8; 525/329.5; 525/329.8; 525/329.7; 526/309; 526/314
[58] Field of Search .............................. 430/270.1, 271.1, 430/944, 176; 525/328.8, 329.5, 329.8, 329.7; 526/309, 314; 101/457, 462, 453

[56] References Cited

U.S. PATENT DOCUMENTS

| | | |
|---|---|---|
| 4,837,124 | 6/1989 | Wu et al. .............................. 430/270.1 |
| 5,120,633 | 6/1992 | Bauer et al. .......................... 430/270.1 |
| 5,332,650 | 7/1994 | Murata et al. ........................ 430/270.1 |
| 5,340,699 | 8/1994 | Haley et al. ........................... 430/302 |
| 5,837,420 | 11/1998 | Aoai et al. ............................ 430/270.1 |

*Primary Examiner*—Cynthia Hamilton
*Attorney, Agent, or Firm*—Breiner & Breiner

[57] ABSTRACT

According to the present invention there is provided a polymer not comprising maleic acid derivatives having acid labile groups pendant from the polymer backbone, characterized in that said pendant groups are represented by $$-L-(C=O)-O-(C=O)-O-C-R^1R^2R^3,$$

wherein L represents a divalent linking group bonded to the polymer backbone, $R^1$ represents an alkyl group of which the linking C atom comprises at least one hydrogen and $R^2$ and $R^3$ each independently represent a hydrogen or an alkyl group or $R^1$ and $R^2$ or $R^2$ and $R^3$ form together a ring compound still with the proviso that the linking C atom of $R^1$ comprises at least one hydrogen.

According to the present invention there is further provided a novel photosensitive composition comprising a latent Bronsted acid and a polymer having acid labile groups pendant from the polymer backbone as described above.

8 Claims, No Drawings

ACID-SENSITIVE SUBSTANCE AND PHOTOSENSITIVE COMPOSITIONS THEREWITH

This application claims the benefit of U.S. Provisional Application No. 60/026,550, filed Sep. 23, 1996.

1. FIELD OF THE INVENTION

The present invention relates to a new group of acid-labile compounds. The present invention further relates to photosensitive compositions. The present invention still further relates to an imaging element for making a lithographic printing plate. The present invention finally relates to a method for preparing a printing plate from said imaging element.

2. BACKGROUND OF THE INVENTION

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy ink in the photo-exposed (negative working) or in the non-exposed areas (positive working) on a hydrophilic background.

In the production of common lithographic plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon imagewise exposure of such light-sensitive layer the exposed image areas become insoluble and the unexposed areas remain soluble. The plate is then developed with a suitable liquid to remove the diazonium salt or diazo resin in the unexposed areas.

The above-described development process can suffer from the drawbacks of being relatively time-consuming and expensive. Furthermore, when volatile organic or strongly alkaline developer solutions are used, their disposal presents an environmental problem.

What is needed in the industry are photosensitive compositions which do not have the above-described drawbacks.

A variety of different materials have been used in photosensitive compositions in the past. Photosensitive compositions employing polymers with pendant acid sensitive moieties have been described in the art (Ito, H.; Ueda, M. Macromolecules 1988, 21, 1475–82). o-Nitrobenzyl substituted polyacrylates have been described in U.S. Pat. No. 3,849,137. t-Butyl substituted polyacrylates have also been reported (Ito, H.; Willson, C. G. in Proc. SPIE-Int. Soc. Opt. Eng. 1987, 771, 24; and U.S. Pat. No. 4,491,628).

U.S. Pat. No. 4,963,463 claims a radiation sensitive resin composition comprising an alkali-soluble resin, an o-quinone diazide, an acid-sensitive ester of nitrobenzyl or cyanobenzyl alcohol.

End-capped polyphthalaldehyde has been employed in imaging systems in combination with onium salts which were used as a source of photogenerated acid (Ito, H.; Willson, C. G. Polym. Eng. Sci. 1983, 23, 1013). Photoresists based on thermal polycarbonate degradation in the presence of photogenerated acid have also been described (Frechet, J. M. J.; Bouchard, F.; Houlihan, F. M.; Kryczka, B.; Eichler, E. ; Clecak, N.; Willson, C. G. J. Imag. Sci. 1986, 30, 59). Both of these systems function by cleavage of the polymer backbone.

Canadian Patent No. 672,947 describes protective films comprising copolymers of tetrahydropyran-2-yl acrylates, and glycidyl esters of acrylates. Those films are thermally processed, thereby effecting cleavage of the tetrahydropyran-2-yl groups, and subsequently causing cross-linking of the carboxylic acid and the epoxy residues.

Benzyl, benzhydryl, and triphenylmethyl acrylates have been imaged using high energy radiation (e.g. electron beam, X-ray, and ion beam) sources followed by development with aqueous alkaline solutions as described in Japanese Kokai applications 59-075244, and 58-068743.

Dimethylbenzyl methacrylates have been employed in combination with iodonium salts as deep-UV photoresists (Ito. H. Polym. Mater. Sci. Eng. 1989, 60, 142).

α-Substituted benzyl methacrylate polymers have been photoimaged and developed with an alkaline developer (Ito, H.; Ueda, M.; Ebina, M. ACS Symp. Ser. 1989, 412, 57–73).

Japanese Kokai applications 63-256492 and 63-317388 describe several direct-image lithographic plate formulations employing polymers having side-chain groups which, following an etching development step, cleave to form hydroxyl and carboxyl groups.

Japanese Kodak patent applications 53-094691 and 53-100192 describe lithographic plates containing polymers with acid labile groups including some alkoxyalkyl esters. The plates also contain cross-linking agents which appear to cross-link with carboxylic acid residues as they are formed. The plates appear to act in a negative-tone and may involve a development step.

Japanese Kokai application 62-299,313 describes the use of polymers containing acid anhydride residues in combination with o-nitrobenzyl esters of carboxylic acids. Those polymers are sensitive only to UV radiation.

U.S. Pat. No. 5,102, 771 discloses photosensitive compositions comprising : (a) a photoinitiator which generates an acid upon exposure to radiation; and (b) a polymer having acid labile groups pendant from the polymer backbone. Those materials were combined with maleic anhydride polymers to provide increased adhesion. However, the resulting photosensitive compositions have only a moderate shelf-life under ambient conditions.

U.S. Pat. No. 5,077,174 (Bauer et al.) also discloses a positive working resist composition which comprises a polymer having acid-labile pendant groups of a defined formula.

EP-A 625728 discloses a lithographic plate with an image forming layer which is UV- and IR-sensitive which can be as well positive as negative working. Said image forming layer comprises (1) a resole resin,(2) a novolac resin, (3) a latent Bronsted acid and (4) an IR absorber. By exposing with UV or IR (830 nm) light followed by a classical PS-plate development a positive working lithographic plate is obtained. If the plate is baked ( 60 seconds at 100° C.) before the development step a negative working printing plate is obtained.

U.S. Pat. No. 4,708,925 discloses a positive working printing plate comprising a light sensitive composition comprising (1) an alkali-soluble novolac resin and an onium-salt and optionally an IR spectral sensitizing dye. By exposing with UV, visible or IR light followed by a development step with an alkali solution there is obtained a positive working printing plate. So there is still a need for acid-sensitive compounds which upon cleavage form a carboxy group instead of a phenolic group so that it is possible to develop a plate comprising an acid-sensitive composition with less aggressive developers and/or for acid-sensitive compounds which decompose at a lower temperature.

3. SUMMARY OF THE INVENTION

It is an object of the present invention to provide a new group of acid-labile compounds.

It is a further object of the present invention to provide photosensitive compositions.

It is another object of the present invention to provide an imaging element for preparing a lithographic plate being radiation and/or heat sensitive.

It is still another object of the present invention to provide a method for obtaining in a convenient way a positive working lithographic printing plate of a high quality using said imaging element.

Further objects of the present invention will become clear from the description hereinafter.

According to the present invention there is provided a polymer not comprising maleic acid derivatives having acid labile groups pendant from the polymer backbone, characterized in that said pendant groups are represented by

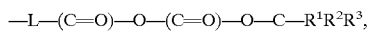

—L—(C=O)—O—(C=O)—O—C—R$^1$R$^2$R$^3$, wherein L represents a divalent linking group bonded to the polymer backbone, R$^1$ represents an alkyl group of which the linking C atom comprises at least one hydrogen and R$^2$ and R$^3$ each independently represent a hydrogen or an alkyl group or R$^1$ and R$^2$ or R$^2$ and R$^3$ form together a ring compound still with the proviso that the linking C atom of R$^1$ comprises at least one hydrogen.

According to the present invention there is also provided a novel photosensitive composition comprising a latent Bronsted acid and a polymer having acid labile groups pendant from the polymer backbone as mentioned above.

According to the present invention there is also provided an imaging element for obtaining a lithographic printing plate comprising on a hydrophilic surface of a lithographic base an image forming layer comprising a latent Bronsted acid and a polymer having acid labile groups pendant from the polymer backbone as mentioned above.

According to the present invention there is also provided a method for obtaining a positive working lithographic printing plate comprising the steps of:

(a) image-wise or information-wise exposing to light or heat an imaging element as described above;

(b) heating said exposed imaging element to provide increased solubility in the exposed areas;

(c) developing said exposed and heated imaging element with an aqueous developing solution in order to remove the exposed areas and thereby form a lithographic printing plate.

4. DETAILED DESCRIPTION OF THE INVENTION

It has been found that polymers as described above yield by decomposition polymers having pendant groups comprising carboxyl functions and do so at temperatures which are clearly lower than the temperatures required for the decomposition of the usual acid-labile compounds.

DE 42 29 816 discloses a photosensitive composition comprising (a) a polymer with recurring units of maleic acid derivatives and (b) photosensitive acid-forming compounds. However the sensitivity of said composition is low.

The polymers according to the invention are polymers having acid labile groups pendant from the polymer backbone, characterized in that said pendant groups are represented by

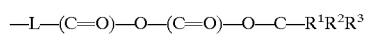

—L—(C=O)—O—(C=O)—O—C—R$^1$R$^2$R$^3$

L represents a divalent linking group bonded to the polymer backbone and can contain a total of from 0 carbon atoms (e.g. a covalent bond) or 1 to 18 carbon atoms where up to one of each two carbon atoms may be replaced by oxygen, nitrogen or sulphur atoms or combinations thereof. Preferably L should contain no functional groups which are more basic than an alkoxyalkyl ester moiety. Representative examples of such functional groups ( which are more basic than the alkoxyalkyl moiety) include, but are not limited to, amines, alkoxides, sulphides, phosphines, amides, urethanes, imides, etc. Non-limiting examples of L include a direct carbon-carbon bond to the polymer backbone, hydrocarbon diyls and oxydiyls, particularly alkanediyls and oxydiyls such as methylidene, 1,3-propanediyl, 1,5-pentanediyl, 2-oxo-propanediyl, phenylene (an arenediyl) and the like.

R$^1$ represents an alkyl group of which the linking C atom comprises at least one hydrogen, preferably with 1 to 18 carbon atoms; R$^2$ and R$^3$ each independently represents an hydrogen group or preferably an alkyl group, more preferably with 1 to 18 carbon atoms or R$^1$ and R$^2$ or R$^2$ and R$^3$ may together form a ring group preferably having from 3 to 36 carbon atoms, still with the proviso that the linking C atom of R$^1$ comprises at least one hydrogen. With regard to R$^1$, R$^2$ and R$^3$ preferred alkyl groups are methyl and ethyl. Preferred ring structures are furanyl and pyranyl The polymers of the present invention are preferably derived from any non-basic (i.e. not containing primary, secundary, tertiary amines or phosphines) polymer backbone, and may be prepared by any of the known in the art methods for preparing polymers (such as free radical, anionic, addition, condensation, and cationic polymerization. Non-limiting examples of non-basic polymer backbones provided with a —L—(C=O)—O—H are polyacrylic acid and cpolymers thereof, polymethacrylic acid and copolymers thereof, polyvinyl benzoic acid and copolymers thereof, polyesters, polyethers, polycarbonates, polysulfides and the like provided with a carboxyl group in a side chain. Preferred polymer backbones provided with a —L—(C=O)—O—H are polyacrylic acid, polymethacrylic acid and polyvinyl benzoic acid. Preferred polymer backbones are derived from free radical polymerized polymers. Additionally, it may be desirably in some applications that the polymer matrix may be cross-linked, while in most instances it is preferably that there be no cross-linking.

The pendant group may be either incorporated within a monomer unit prior to polymerization or completed to an already formed polymer backbone. Said polymers may be prepared in the following way. To a solution of 0.35 mole of dry alcohol having at least one hydrogen on a β carbon atom in 80 ml of tetrahydrofurane (THF) was added at 0° C. 0.200 mole of butyl lithium in 80 ml of hexane under nitrogen. After dilution of the reaction mixture with dimethyl formamide (DMF), dry carbon dioxyde was introduced till saturation (approximately 1 hour to 3 hours). Next a solution of 0.15 mole of the monomeric acid chloride in 25 ml of DMF was added during a period of 5 minutes. After 5 minutes reaction time at room temperature the reaction mixture is poured out in a mixture of ice and hexane/diethylether (1:1, 500 ml). After extraction of the organic phase with saturated aqueous sodium bicarbonate (2×250 ml), drying of the organic phase and evaporation of the solvent, the monomer is obtained in a yield between 90 and 100%. The monomer was characterized by IR- , $^1$H-NMR- and $^{13}$C-NMR-spectroscopy.

The polymerization of said monomer to a polymer was executed by a classical free radical polymerization. To a solution of 0.100 mole of said monomer in 60 ml of toluene was added 1.55 g of bis(4-tert.butyl-cyclohexyl) peroxydicarbonate. Nitrogen was allowed in the reaction mixture to remove the oxygen. This solution was then shaked at 45° C. for 4 hours. The polymer formed was precipitated with methanol in a temperature range between −10° C. to −50° C. After drying the polymer was obtained. The polymer was characterized by IR-, $^1$H-NMR- and $^{13}$C-NMR-spectroscopy, DSC and TGA.

As a less preferred mode for preparing said polymers having acid labile groups pendant from the polymer backbone according to the invention the following reaction path is followed. To a solution of thionyl chloride in anhydrous DMF was added under nitrogen in an ice bath dropwise the polymer acid while stirring and afterwards keeping the reaction mixture for 4 hours below 10° C. and 1 hour at 40° C. After removal od unreacted thionyl chloride, a saturated solution of Li—O—(C=O)—O—C—$R^1R^2R^3$ in THF/DMF was added. The reaction mixture was left standing overnight at room temperature. After the addition of ice to the reaction mixture, the desired polymer was obtained by precipitation into an excess of methanol. The conversion rate was determined by IR-spectroscopy to be quantitative.

Preparation Example 1
Preparation of Poly(4-vinylbenzoyl t-butyl-carboxylic Acid anhydride)=PVBtBCA Preparation of 4-vinylbenzoyl t-butyl-carboxilic acid anhydride To a solution of 25 ml dry tert.-butanol in 80 ml THF (at 0° C.) was added 80 ml butyl lithium (2.5 M in hexane) under nitrogen. After dilution of the reaction mixture with 180 ml DMF, dry $CO_2$ was introduced for approximately 1 hour. Next a solution of p-vinylbenzoyl chloride (25 g in 25 ml DMF) was added during a period of 5 minutes. After 5 minutes reaction time at room temperature the reaction mixture is poured out in a mixture of ice and hexane/diethylether (1/1; 500 ml). After extraction with saturated $NaHCO_3$ (2×250 ml), drying of the organic phase and evaporation of the solvent, the monomer is obtained. 37.2 g of the pure monomer was obtained. The monomer was characterized by IR-, $^1$H-NMR- and $^{13}$C-NMR-spectroscopy.

Polymerisation of 4-vinylbenzoyl t-butyl-carboxylic acid anhydride

To a solution of 24 g 4-vinylbenzoyl t-butyl-carboxylic acid anhydride in 60 ml toluene was added 1.55 g of bis(4-tert.butyl-cyclohexyl)peroxydicarbonate. Nitrogen was allowed in the reaction mixture to remove the oxygen. This solution was then shaked at 45° C. for 4 hours. The polymer formed was precipitated with MeOH at −20° C. After drying 20.4 g (84.4%) of poly(4-vinylbenzoyl t-butyl-carboxylic acid anhydride) was obtained. The polymer was characterized by IR-, $^1$H-NMR- and $^{13}$C-NMR- spectroscopy, DSC an TGA $M_W$=367.000; $M_n$=24.000; $T_{dec.}$=114° C.

Preparation Example 2
Preparation of Poly(methacryloyl t-butyl-carboxylic Acid Anhydride)=PMtBCA Preparation of methacryloyl t-butyl-carboxylic acid anhydride To a solution of 30 ml dry tert.-butanol in 200 ml THF (at 0° C.) was added 100 ml butyl lithium (2.5 M in hexane) under nitrogen. After dilution of the reaction mixture with 200 ml DMF, dry $CO_2$ was introduced for approximately 3 hours. Next a solution of methacryloyl chloride (33.3 g in 25 ml DMF) was added. After 5 minutes reaction time at room temperature the reaction mixture is poured out in a mixture of ice and hexane/diethylether (1/1; 500 ml). After extraction with saturated $NaHCO_3$ (2×250 ml), drying of the organic phase and evaporation of the solvent, the monomer is obtained. 46.5 g of the pure monomer was obtained. The monomer was characterized by IR-, $^1$H-NMR- and $^{13}$C-NMR-spectroscopy.

Polymerisation of methacryloyl t-butyl-carboxylic acid anhydride

To a solution of 2 g methacryloyl t-butyl-carboxylic acid anhydride in 6 ml toluene was added 0.17 g bis(4-tert.butyl-cyclohexyl)peroxydicarbonate. Nitrogen was allowed in the reaction mixture to remove the oxygen. This solution was then shaked at 45° C. for 1 hours. The polymer formed was precipitated with MeOH at −40° C. After drying 0.45 g (25%) of poly(methacryloyl t-butyl-carboxylic acid anhydride) was obtained. The polymer was characterized by IR-, $^1$H-NMR- and $^{13}$C-NMR-spectroscopy, DSC an TGA: $M_W$=44.100; $M_n$=24.200; $T_{dec.}$=112° C.

In some instances it is preferred to add at least one additional polymer to the photosensitive composition of the present invention. Said polymers may generate additional hydrophilic functionality upon exposure to light and increase the difference in solubility between the exposed and unexposed areas of the photosensitive composition. Hydrophobicpolymers may be added to increase durability or adhesion.

Exposure of the plate to radiation is believed to decompose the latent Bronsted acid in the exposed areas. The decomposition products are believed to decompose the polymers according to the present invention and to liberate carboxyl groups on said polymers according to the following reaction scheme:

—L—(C=O)—O—(C=O)—O—C—$R^1R^2R^3$

The second essential ingredient of the radiation-sensitive composition of this invention is a latent Bronsted acid. The term "latent Bronsted acid" refers to a precursor which forms a Bronsted acid by decomposition. Typical examples of Bronsted acids which are suitable for this purpose but not limited to are sulphonic acids e.g. trifluoromethane sulphonic acid and hexafluorophosphoric acid.

Ionic latent Bronsted acids are suitable for use in this invention. Examples of these include onium salts, in particular iodonium, sulfonium, phosphonium, selenonium, diazonium and arsonium salts.

Useful ionic latent Bronsted acids include those represented by the formula $X^+R_1R_2R_3R_4W^−$ When X is iodine then $R_3$ and $R_4$ are electron lone pairs and $R_1$ and $R_2$ each independently are aryl or substituted aryl groups. When X is S or Se then $R_4$ is an electron lone pair and $R_1$, $R_2$ and $R_3$ each independently can be an aryl group, a substituted aryl group, an aliphatic group or a substituted aliphatic group. When X is P or As, then $R_1$, $R_2$, $R_3$ and $R_4$ each independently can be an aryl group, a substituted aryl group, an aliphatic group or a substituted aliphatic group. W can be $BF_4$, $CF_3SO_3$, $SbF_6$, $CCl_3CO_2$, $ClO_4$, $AsF_6$, $PF_6$, or any corresponding acid whose pH is less than three.

Any of the onium salts described in U.S. Pat. No. 4,708, 925 can be utilized as the latent Bronsted acid in this invention. These include iodonium, sulfonium, phosphonium, bromonium, chloronium, oxysulfoxonium, oxysulfonium, sulfoxonium, selenonium, telluronium and arsonium salts.

Use of diazonium salts as latent Bronsted acids is particularly preferred in this invention. They provide higher sensitivity in the ultraviolet region than other latent Bronsted acids. Specific examples of particularly useful onium salts include:

diphenyliodonium hexafluorophosphate, triphenylsulfonium hexafluoroantimonate, phenylmethyl-ortho-cyanobenzylsulfonium trifluoromethane sulfonate, and 2-methoxy-4-aminophenyl diazonium hexafluorophosphate Non-ionic latent Bronsted acids are also suitable for use in this invention. Examples of these include compounds of the formula:

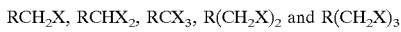

RCH$_2$X, RCHX$_2$, RCX$_3$, R(CH$_2$X)$_2$ and R(CH$_2$X)$_3$ wherein X is Cl, Br, F, or $CF_3SO_3$ and R is an aromatic group or an aliphatic group.

Further suitable non-ionic latent Bronsted acids are haloalkyl-substituted s-triazines as disclosed in EP-A 672954. o-quinone diazides, photo acid generating agents having an o-nitrobenzyl type protective group as described in *Polymer Sci.*, by S. Hayase et al, 25, 573 (1987); the compounds which are subjected to a photodecomposition to generate a sulfonic acid, represented by iminosulfonates as described in *Polymer Preprints* Japan, by M. Tunooka et al, 35 (8), by disulfon compounds described in JP-Pi 61-166544, by α-sulphonyloxy ketones, by α-hydroxymethylbenzoine sulphonates, by nitrobenzyl sulphonates, by α-sulphonyl acetophenones and by sulphonyl imides, the preparation of these last compounds being well known in the literature; the compounds which are subjected to a photodecomposition to generate a phosphonic acid, a partly esterified phosphoric acid or phosphoric acid, represented by nitrobenzylphosphates or phosphonates as described in *Tetrahedron Letters,* by M. Rubinstein et al., 17, 1445 (1975), by benzoine phosphates or phosphonates, as described in *J. Org. Chem.* by M. Pirrung and S. Shuey, 59, 3890 (1994), by pyrenemethylphosphates or phosphonates, by iminophosphates or phosphonates and by imidophosphates or phosphonates, the preparation of these last compounds being well known in the literature.

Further, compounds in which the above photosensitive acid precursors are introduced into a primary chain or a side chain of a polymer can be used. Examples thereof include the compounds described in e.g. *J. Am. Chem. Soc.*, by M. E. Woodhouse et al, 104, 5586 (1982); *J. Imaging Sci.,* by S. P. Pappas et al, 30 (5). 218 (1986); etc.

The photosensitive composition employed in the present invention may be either exposed to ultraviolet radiation or sensitized into the visible and/or the infrared spectrum. Wavelengths between 250 and 1500 nm may be used. Preferably wavelengths between 250 and 450 nm and 650 and 1100 nm are used.

Compounds useful as sensitizing dyes for the visible spectrum according to this invention include, but are not limited to aryl nitrones, xanthenes, anthraquinones, substituted diaryl- and triarylmethanes, methines, merocyanines, polymethines, thiazoles, substituted and unsubstituted polycyclic aromatic hydrocarbons such as e.g. dialkoxy anthracenes, and pyrylium dyes.

Compounds useful as sensitizing dyes for the infrared spectrum according to this invention are infrared absorbers. The infrared absorber renders the composition sensitive to infrared radiation and makes the printing plate useful as a direct laser addressable plate which can be imaged by exposure to a laser which emits in the infrared region.

The infrared absorber can be a dye or pigment. A very wide range of such compounds is well known in the art and includes dyes or pigments of the squarylium, croconate, cyanine, merocyanine, indolizine, pyrylium and metal dithiolene classes. It is preferred that the infrared absorber fragments upon exposure to the activating radiation since the decomposition products promote increased contrast between image and non-image areas and thereby help in the development process.

Additional infrared absorbers that are of utility in this invention include those described in U.S. Pat. No. 5,166, 024, issued Nov. 24, 1992. As described in the '024 patent, particularly useful infrared absorbers are phthalocyanine pigments.

As explained hereinabove, the two essential ingredients of the radiation-sensitive composition of this invention are a polymer with acid labile groups pendant from the polymer backbone according to the invention and a latent Bronsted acid. Other ingredients which can optionally be incorporated in the composition include colorants, stabilizers, additional sensitizers, exposure indicators and surfactants.

The thickness of the image forming layer in the printing plates of this invention can vary widely. Typically, a dry thickness in the range of from 0.25 to 10 micrometers, more preferably from 0.75 to 5 micrometers is suitable.

To form the radiation sensitive imaging element, the polymer with acid labile groups pendant from the polymer backbone according to the invention, the latent Bronsted acid and the other optional ingredients are dissolved or dispersed in a suitable solvent in appropriate proportions and coated on the support using such well-known coating techniques as spin coating or hopper coating. Preferred solvents include acetone, methylethylketone and 1-methoxy-2-propanol.

The polymer with acid labile groups pendant from the polymer backbone according to the invention is preferably incorporated in the coating composition in an amount of from 1.0 to 20 percent by weight, more preferably from 5 to 15 percent by weight, and most preferably from 7.0 to 13 percent by weight.

The latent Bronsted acid is preferably incorporated in the coating composition in an amount of from 0.1 to 10 percent by weight, more preferably from 0.25 to 5 percent by weight, and most preferably from 0.50 to 3.00 percent by weight.

The optional spectral sensitizer is preferably incorporated in the coating composition in an amount of from 0.1 to 3 percent by weight, more preferably from 0.15 to 2.0 percent by weight, and most preferably from 0.20 to 1.00 percent by weight.

Suitable conditions for drying the layer involve heating for a period of from 0.5 to 10 minutes at a temperature in the range of from 20° C. to 150° C.

According to one embodiment of the present invention, the lithographic base can be an anodised aluminum support.

A particularly preferred lithographic base is an electrochemically grained and anodised aluminum support. According to the present invention, an anodised aluminum support may be treated to improve the hydrophilic properties of its surface. For example, the aluminum support may be silicated by treating its surface with sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or can be carried out at a slightly elevated temperature of about 30 to 50° C. An interesing treatment involves treating the aluminum oxide surface with polyvinyl phosphonic acid as disclosed in DE-OS 2,607,207. A further interesting treatment involves rinsing the aluminum oxide surface with a bicarbonate solution. It is further evident that one or more of these post treatments may be carried out alone or in combination.

According to another embodiment in connection with the present invention, the lithographic base comprises a flexible support, such as e.g. paper or plastic film, provided with a cross-linked hydrophilic layer. A particularly suitable cross-linked hydrophilic layer may be obtained from a hydrophilic binder cross-linked with a cross-linking agent such as formaldehyde, glyoxal, polyisocyanate or a hydrolysed tetra-alkylorthosilicate. The latter is particularly preferred.

As hydrophilic binder there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight The amount of crosslinking agent, in particular of tetraalkyl orthosilicate, is preferably at least 0.2 parts by weight per part by weight of hydrophilic binder, preferably between 0.5 and 5 parts by weight, more preferably between 1.0 parts by weight and 3 parts by weight.

A cross-linked hydrophilic layer in a lithographic base used in accordance with the present embodiment preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm. e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas.

The thickness of a cross-linked hydrophilic layer in a lithographic base in accordance with this embodiment may vary in the range of 0.2 to 25 μm and is preferably 1 to 10 μm.

Particular examples of suitable cross-linked hydrophilic layers for use in accordance with the present invention are disclosed in EP-A 601240, GB-P-1419512, FR-P-2300354, U.S. Pat. No. 3,971,660, U.S. Pat. No. 4,284,705 and EP-A 514490.

As flexible support of a lithographic base in connection with the present embodiment it is particularly preferred to use a plastic film e.g. substrated polyethylene terephthalate film, cellulose acetate film, polystyrene film, polycarbonate film etc. The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A 619524, EP-A 620502 and EP-A 619525. Preferably, the amount of silica in the adhesion improving layer is between 200 mg per $m^2$ and 750 mg per $m^2$. Further, the ratio of silica to hydrophilic binder is preferably more than 1 and the surface area of the colloidal silica is preferably at least 300 $m^2$ per gram, more preferably at least 500 $m^2$ per gram.

The lithographic printing plates can be exposed with conventional ultraviolet radiation sources, including carbon arc lamps, mercury vapor lamps, fluorescent lamps, and photoflood lamps. The lithographic printing plates can also be exposed with conventional visible light radiation sources, including xenon lamps and tungsten lamps.

The lithographic printing plates of this invention when comprising an infrared sensitizer can also be exposed with a laser diode which emits radiation in the near-infrared region of the spectrum. Such laser diodes provide the advantage of both low cost and low energy consumption.

A particularly suitable exposing device in such case is a laser diode with a maximum output in the wavelength range from about 830 nm to 1100 nm. Such a device is typically capable of decomposing both the latent Bronsted acid and the optional infrared absorber in the exposed areas. The products from the thermal decomposition are mainly strong acids which are effective in liberating the carboxyl groups of the polymers according to the invention and so increasing the solubility of the exposed areas.

The lithographic printing plates of this invention can also be exposed with a thermal head.

The imagewise-exposed plate is heated in a step that is referred to as a post-exposure bake or PEB. The heating step is conducted at a temperature in the range of from 70° C. to 150° C. for a period of from 30 to 900 seconds. More preferably, the heating is for a period of from 120 to 500 seconds at a temperature in the range of from 80° C. to 135° C. Said heating step can be omitted when the image-wise exposure is done by IR-exposure or by exposure with a printing head because during said exposure the imaging element is also image-wise heated.

After the PEB is completed, the plate is then either hand processed or machine processed in an aqueous alkaline developing solution until the non-image areas are removed. This typically requires 30 to 120 seconds. A preferred aqueous alkaline developing solution is a silicate solution such as a six percent by weight aqueous solution of sodium meta-silicate. A suitable commercially available silicate solution for this purpose is KODAK AQUA-IMAGE POSITIVE DEVELOPER MX-1406-1 which is sold by Eastman Kodak Company or Fuji PS-plate developer DP-5 which is sold by Fuji Company. After contact with the aqueous alkaline developing solution, the plate is usually treated with a finisher such as gum arabic.

The number of printing impressions obtainable is primarily dependent upon use of a post development baking step.

If no such baking step is used, the plate typically provides 60000 to 70000 impressions, whereas post development baking for 5 minutes at 250° C. typically provides 300000 to 350000 impressions. The number of impressions that can be attained before wear is detected can also be. increased by increasing the coating weight.

If the imaging element of this invention is infrared sensitive, digital imaging information can be conveniently utilized to form continuous or halftone images using a suitable source of infrared radiation such as a laser diode emitting in the infrared region. Since the printing plate of this invention is also ultraviolet sensitive, it can also be conveniently imaged so as to form continuous or halftone images by ultraviolet exposure through a suitable imaging master such as a silver halide film. Because of these characteristics, the same plate can be utilized in equipment intended for input of electronic data by writing with a laser or in the type of equipment that is commonly employed to carry out ultraviolet exposure of lithographic printing plates. It is thus an easy matter to combine digital or electronic imaging techniques with conventional optical imaging techniques, i.e., to use both types of imaging with the same printing plate. Accordingly information not available in an electronic format can be added by optical imaging techniques to complete the imaging of the lithographic printing plate when it is desired to do so.

The following examples illustrate the present invention without however, limiting it thereto. All parts, percentages and ratios are by weight unless otherwise indicated.

EXAMPLE 1

Preparation of the lithographic base

A 0.20 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 A/m² to form a surface topography with an average center-line roughness Ra of 0.5 μm. After rinsing with demineralized water the aluminum foil was then etched with an aqueous solution containing 300 g/l of sulfuric acid at 60° C. for 180 seconds and rinsed with demineralized at 25° C. for 30 seconds.

The foil was subsequently subjected to anodic oxidation in an aqueous solution containing 200 g/l of sulfuric acid at a temperature of 45° C., a voltage of about 10 V and a current density of 150 A/m² for about 300 seconds to form an anodic oxidation film of 3.00 g/m² of Al₂O₃, then washed with demineralized water, posttreated with a solution containing 20 g/l of sodium bicarbonate at 40° C. for 30 seconds, subsequently rinsed with demineralized water at 20° C. during 120 seconds and dried.

Preparation of the lithographic printing plate

Onto the lithographic aluminum base was coated a photosensitive composition prepared by mixing 0.4 g PMtBCA (preparation example 2). 0.05 g TRIAZINE-S ( 2,4,6-(trichloromethyl)-s-triazine from P.C.A.S.), 0.025 g thioxanton, 0.179 g of a dye dispersion (14% w/w HOS-TAPERM BLAU B3G01 in methyl ethyl ketone) (blue dye available from HOECHST) and 4.345 g methyl ethyl ketone. This compostion was coated to a wet coating thickness of 20 μm and dried. On top of the lithographic printing plate was then placed in face-to-face contact a test target with a 60 lines per cm screen as well as fine positive and negative lines, and the imaging element was exposed therethrough to ultraviolet radiation. Next the exposed sample was heated in an oven for 5 minutes at 120° C. The heated plated was then allowed to cool to room temperature. The imaging element was then processed with Fuji PS-plate developer DP-5 to remove the exposed areas resulting in a positive working lithographic printing plate. The obtained image on the lithographic base could be used to print on a conventional offset press using a commonly employed ink and fountain. Excellent copies were obtained.

EXAMPLE 2

Onto the lithographic aluminum base of example 1 was coated a photosensitive composition prepared by mixing 0.4 g PVBtBCA (preparation example 1). 0.05 g TRIAZINE-S (2,4,6-(trichloromethyl)-s-triazine from P.C.A.S.), 0.025 g thioxanton, 0.179 g of a dye dispersion (14% w/w HOS-TAPERM BLAU B3C11 in methyl ethyl ketone) (blue dye available from HOECHST) and 4.345 g methyl ethyl ketone. This compostion was coated to a wet coating thickness of 20 μm and dried.

On top of the lithographic printing plate was then placed in face-to-face contact a test target with a 60 lines per cm screen as well as fine positive and negative lines, and the imaging element was exposed therethrough to ultraviolet radiation. Next the exposed sample was heated in an oven for 5 minutes at 120° C. The heated plated was then allowed to cool to room temperature. The imaging element was then processed with Fuji PS-plate developer DP-5 to remove the exposed areas resulting in a positive working lithographic printing plate. The obtained image on the lithographic base could be used to print on a conventional offset press using a commonly employed ink and fountain. Excellent copies were obtained.

EXAMPLE 3

Onto the lithographic aluminum base of example 1 was coated an IR-sensitive composition prepared by mixing 0.41 g PVBtBCA (preparation example 1), 0.05 g TRIAZINE-S (2,4,6-(trichloromethyl)-s-triazine from P.C.A.S), 0.015 g of IR-I, 0.179 g of a dye dispersion (14% w/w HOSTAPERM BLAU B3G01 (blue dye available from HOECHST) in

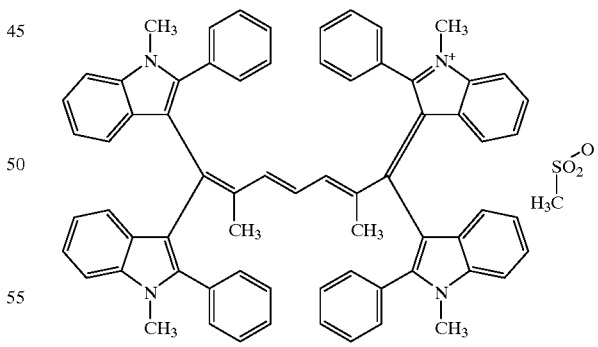

methyl ethyl ketone) and 4.345 g methyl ethyl ketone. This compostion was coated to a wet coating thickness of 20 μm. The IR-sensitive printing plate was subjected to a scanning diode-laser emitting at 830 nm (scanspeed 1.1 m/s, spot size 15 pm and the power on the plate surface was varied from 60 to 120 mW ). After imaging the plate was heated in an oven for 150 seconds at 115° C. and cooled to room temperature. The imaging element was then processed with Fuji PS-plate developer DP-5 to remove the exposed areas resulting in a positive working lithographic printing plate. The obtained image on the lithographic base could be used to print on a conventional offset press using a commonly employed ink and fountain. Excellent copies were obtained.

We claim:

1. An imaging element for obtaining a lithographic printing plate comprising on a hydrophilic surface of a lithographic base an image forming layer comprising a latent Bronsted acid and a polymer having acid labile groups pendant from the polymer backbone and free of maleic acid derivatives, characterized in that said pendant groups are represented by

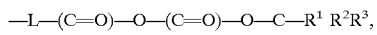

$$-L-(C=O)-O-(C=O)-O-C-R^1\ R^2R^3,$$

wherein L represents a divalent linking group bonded to the polymer backbone, $R^1$ represents an alkyl group of which the linking C atom comprises at least one hydrogen and $R^2$ and $R^3$ each independently represent a hydrogen or an alkyl group or $R^1$ and $R^2$ or $R^2$ and $R^3$ form together a ring compound still with the proviso that the linking C atom of $R^1$ comprises at least one hydrogen.

2. An imaging element for obtaining a lithographic printing plate according to claim 1 wherein said latent Bronsted acid is an ionic latent Bronsted acid.

3. An imaging element according to claim 2 wherein said ionic latent Bronsted acid is an iodonium, sulphonium, selononium, diazonium or arsonium salt.

4. An imaging element according to claim 1 wherein said latent Bronsted acid is a non-ionic latent Bronsted acid.

5. An imaging element according to claim 4 wherein said non-ionic latent Bronsted acid is a haloalkyl-substituted s-triazine.

6. An imaging element according to claim 1 wherein said image forming layer comprises an ultraviolet light absorbers said ultraviolet light absorber being capable of sensitizing the decomposition of the latent Bronsted acid.

7. An imaging element according to claim 1 wherein said image forming layer comprises a visible light absorber, said visible light absorber being capable of sensitizing the decomposition of the latent Bronsted acid.

8. An imaging element according to claim 1 wherein said image forming layer comprises an infrared light absorber, said infrared light absorber being capable of sensitizing the decomposition of the latent Bronsted acid.

* * * * *